US006566911B1

(12) United States Patent
Moyer

(10) Patent No.: US 6,566,911 B1
(45) Date of Patent: May 20, 2003

(54) MULTIPLE-MODE CMOS I/O CELL

(75) Inventor: Todd K. Moyer, Aurora, OR (US)

(73) Assignee: Pixelworks, Inc., Tualatin, OR (US)

( * ) Notice: Subject to any disclaimer, the term of this patent is extended or adjusted under 35 U.S.C. 154(b) by 0 days.

(21) Appl. No.: 10/150,420

(22) Filed: May 17, 2002

Related U.S. Application Data

(60) Provisional application No. 60/292,182, filed on May 18, 2001.

(51) Int. Cl.$^7$ ............... H03K 19/0175; H03K 19/094

(52) U.S. Cl. ........................... 326/83; 326/112

(58) Field of Search ............ 326/82–83, 86–87, 326/112, 119, 121

(56) References Cited

U.S. PATENT DOCUMENTS

| 4,716,312 | A | * | 12/1987 | Mead et al. | ............... 326/97 |
| 5,519,728 | A | * | 5/1996 | Kuo | .................... 375/257 |
| 5,994,921 | A | * | 11/1999 | Hedberg | ................. 326/81 |
| 6,069,495 | A | * | 5/2000 | Ciccone et al. | ............. 326/98 |
| 6,218,863 | B1 | | 4/2001 | Hsu et al. | |

OTHER PUBLICATIONS

National Semiconductor: *FPD87310 Universal Interface XGA Panel Timing Controller with RSDS (Reduced Swing Differential Signaling)*™ *and FPD–Link*; May, 2000; pp. 1–10.

National Semiconductor Corp.: *RSDS*™ *Interface Specification*; Revision 0.95, May 2001; pp. 1–8.

National Semiconductor: Owner's Manual; *Introduction to LVDS*; from website located at http://www.national.com/appinfo/lvds; Revision 2.0, Spring 2000; pp. 1–8.

* cited by examiner

Primary Examiner—Michael Tokar
Assistant Examiner—James H. Cho
(74) Attorney, Agent, or Firm—Marger Johnson McCollom, PC

(57) ABSTRACT

A CMOS output cell with multiple output modes is disclosed. In one embodiment, the cell drives a differential output signal on two output pads in one mode and two single-ended output signals on the two output pads in another mode. Differential and single-ended driver transistors are included for this purpose. A logic circuit disables unused driver transistors, and supplies appropriate drive signals to those transistors for each mode. When disabled, the driver transistors serve an electrostatic discharge (ESD) protection function, at least partially alleviating the need for ESD-specific devices in the cell. The diminished need for ESD-specific devices allows the cell to offer a highly flexible chip interface, with little or no increase in circuit area over a conventional cell that offers only single-ended or differential output.

16 Claims, 8 Drawing Sheets

MULTIPLE-MODE CMOS I/O CELL

This application claims the benefit of Provisional application No. 60/292/182, filed May 18, 2001.

FIELD OF THE INVENTION

This present invention relates generally to CMOS (complementary metal-oxide semiconductor) integrated circuits, and more particularly to I/O (input/output) structures and methods for such circuits.

BACKGROUND OF THE INVENTION

Integrated circuits transmit and receive electrical signals to and from other circuitry using input and output "cells" designed for that purpose. The physical connection between each input or output cell and outside circuitry is conventionally made by bonding a small wire to a bonding "pad", i.e., an extended and exposed conductive region located on one of the circuit's metal layers. For an input cell, receiving circuitry connects to the bonding pad. For an output cell, a transmitter or driver circuit connects to the bonding pad. Typically, both input and output cells also contain Electro-Static Discharge (ESD) protection circuitry that attempts to clamp large transient voltages (inadvertently applied to a bonding pad) before those voltages can damage a receiver or driver.

FIGS. 1, 2, and 3 illustrate three aspects of a simple output cell 20. Referring first to FIG. 1, P-channel MOS (PMOS) transistor 22 and N-channel (NMOS) transistor 24 operate as a complementary field-effect transistor (FET) pair signal driver. When signal IN is at a high voltage, transistor 22 is turned off and transistor 24 is turned on, pulling output pad 25 down towards Vss. Conversely, when signal IN is at a low voltage, transistor 24 is turned off and transistor 22 is turned on, pulling output pad 25 up towards Vdd.

PMOS transistor 26 and NMOS transistor 28 provide ESD protection for cell 20. Note that the gate of transistor 26 is permanently connected to Vdd, and the gate of transistor 28 is permanently connected to Vss, ensuring that these transistors are permanently off. But as shown in FIG. 2, transistors 26 and 28 contain diode structures that provide protection against voltage spikes. PMOS transistor 26 protects the cell from pad voltages much greater than Vdd, and NMOS transistor 28 protects the cell from pad voltages much less than Vss.

FIG. 3 shows a cross-section of transistors 26 and 28. Within PMOS transistor 26, a diode junction exists between the P+ drain diffusion 36 (connected to output pad 25) and the N-well drain diffusion 32 (connected to Vdd). Thus when the voltage at output pad 25 is slightly higher than Vdd, this diode junction is forward biased and current can flow from the pad to the Vdd voltage rail, clamping the pad voltage to a safe level.

Similarly, within NMOS transistor 28, a diode junction exists between the N+ drain diffusion 40 (connected to output pad 25) and the P-substrate 30 (connected to Vss). Thus when the voltage at output pad 25 is slightly lower than Vss, this diode junction is forward biased and current can flow from the Vss voltage rail to the pad, again clamping the pad voltage to a safe level.

SUMMARY OF THE INVENTION

Although transistors 26 and 28 in FIG. 1 are included for ESD protection, it is recognized herein that driver transistors 22 and 24 can have similar—albeit typically smaller due to smaller size—ESD benefits if their bodies are biased appropriately. The described embodiments make use of this observation in an output cell having no (or reduced-size) ESD-only devices, augmented with multiple sets of driver transistors. The output cell contains a multimode logic circuit that, in each mode, configures at least some sets of driver transistors in an "off" mode that provides ESD protection.

For instance in one embodiment, an input/output cell connects to two pads. The cell has one set of differential drivers that allows a signal to be driven differentially on the two pads in one mode. The cell also has a set of single-ended drivers that allow two different signals to be driven on the two pads in another mode. In still another mode, the cell accepts input signals on the two pads. A multimode logic circuit selects the appropriate drivers for each mode, and turns off the remaining drivers, essentially placing them in an ESD mode.

One beneficial use of such an embodiment is in providing a flexible interface for an integrated circuit. Historically, a designer had to choose an interface type for each pad from a library of standard input and output cells. If two customers desired two different interface types, the circuit designer had to either design and manufacture two different integrated circuits, or provide two sets of pads and accompanying cells, one per interface type, on the circuit. Either approach is more expensive than the preferred embodiments described herein, which supply multiple different interface types on the same pads, at no significant increase in circuit area or cost.

BRIEF DESCRIPTION OF THE DRAWINGS

The invention may be best understood by reading the disclosure with reference to the drawing, wherein.

DETAILED DESCRIPTION OF THE EMBODIMENTS

Figure 1:
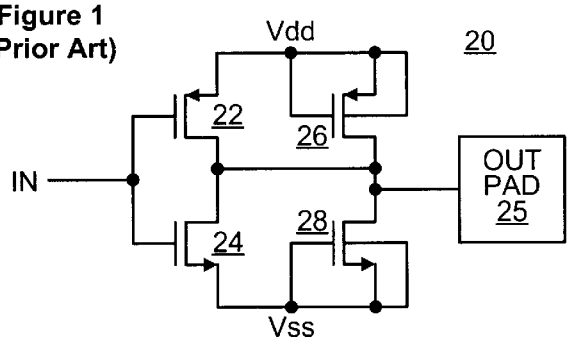
FIG. 1 illustrates a prior art single-ended output cell.
Figure 2:
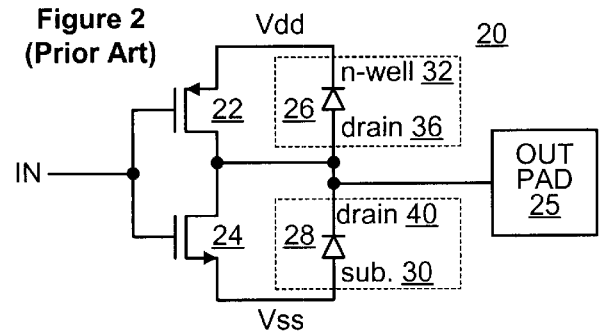
FIG. 2 shows an ESD equivalent circuit for the cell of FIG. 1.
Figure 3:
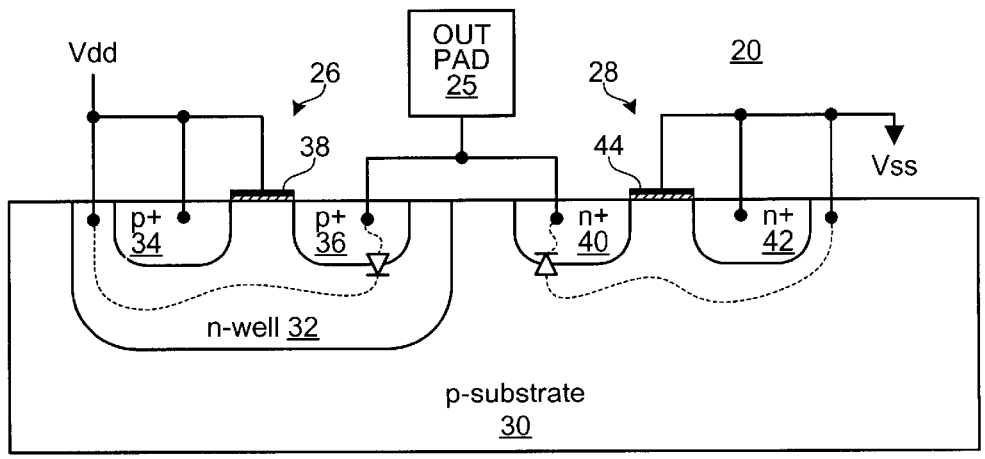
FIG. 3 shows the ESD transistors of the FIG. 1 cell in cross-section.
Figure 4:
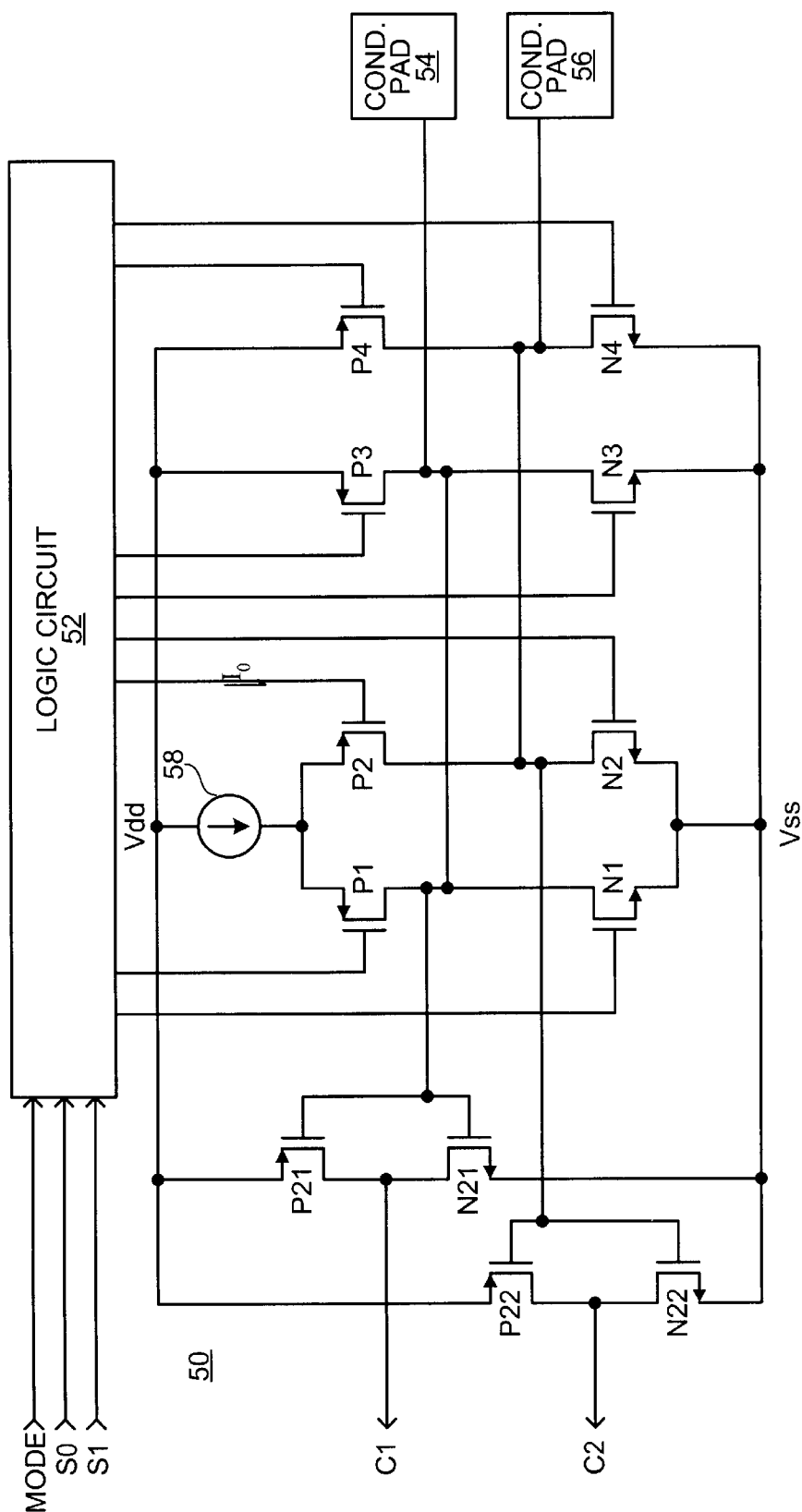
FIG. 4 illustrates a multimode I/O cell according to a first embodiment of the invention.

FIG. 4 contains a simplified block diagram for an input/output cell 50 according to one embodiment of the invention. Logic circuit 52 accepts two input signals S0 and S1, and a mode signal MODE. Logic circuit 52 provides signals to the gates of four CMOS transistor pairs: pair P1, N1; pair P2, N2; pair P3, N3; and pair P4, N4. The two transistors of each pair are connected at their drains to a drain node—the drain nodes of pairs P1, N1 and P3, N3 connect to a first conductive pad 54, and the drain nodes of pairs P2, N2 and P4, N4 connect to a second conductive pad 56. The source of each N-channel transistor (N1, N2, N3, N4) couples to a reference or ground voltage Vss. The source of each P-channel transistor (P1, P2, P3, P4) couples to a supply voltage Vdd. P1 and P2 couple to Vdd through a common current source 58, placing pairs P1, N1 and P2, N2 in a differential configuration.

Although not necessary if the cell will be used only for signal output, cell 50 also includes two additional CMOS transistor pairs, P21, N21 and P22, N22. Pair P21, N21 inverts and drives the signal received on conductive pad 54, producing an input signal C1. Pair P22, N22 inverts and drives the signal received on conductive pad 56, producing an input signal C2.

When MODE is set to a first output mode, logic circuit 52 turns off pairs P3, N3 and P4, N4, e.g., by supplying Vdd to the gates of P3 and P4, and Vss to the gates of N3 and N4. S0 is used in this mode to drive the gates of P1, P2, N1, and N2 as a differential current-mode driver. For instance, when S0 is at a logic low level, logic circuit 52 turns on P1 and N2 and turns off N1 and P2, such that current $I_0$ flows out pad 54 and in pad 56. And when S0 transitions to a logic high level, logic circuit 52 reverses this on/off pattern, such that current $I_0$ flows out pad 56 and in pad 54.

S0 could optionally be an analog output signal instead of a logic signal, in which case logic circuit 52 can create appropriate analog drive signals for pairs P1, N1 and P2, N2.

When MODE is set to a second output mode, logic circuit 52 turns off pairs P1, N1 and P2, N2, e.g., by supplying Vss to the gates of all four transistors and turning off current source 58. S0 is used in this mode to drive the gates of P3 and N3 as a single-ended voltage driver. In the second mode, logic circuit 52 can drive the gates of P4 and N4 as a second single-ended voltage driver. MODE can of course have multiple sub-modes in which the mapping of signals S0 and S1 onto bonding pads 54, 56 can be one of the following: S0, S1; S1, S0; S0, none; S1, none; none, S0; or none, S1. Note that if one of the pairs P3, N3 and P4, N4 is never used as a voltage driver, the logic circuit need not control the gates of that pair, and that pair can be configured as a conventional ESD circuit by connecting the gates of that pair permanently to their respective voltage rails.

For the embodiment shown in FIG. 4, MODE can also be set to an input mode that turns off all output drivers, placing all in an ESD mode. Input signals can then be received on one or both of pads 54 and 56, and passed to the integrated circuit as C1 and C2.

Figure 5:
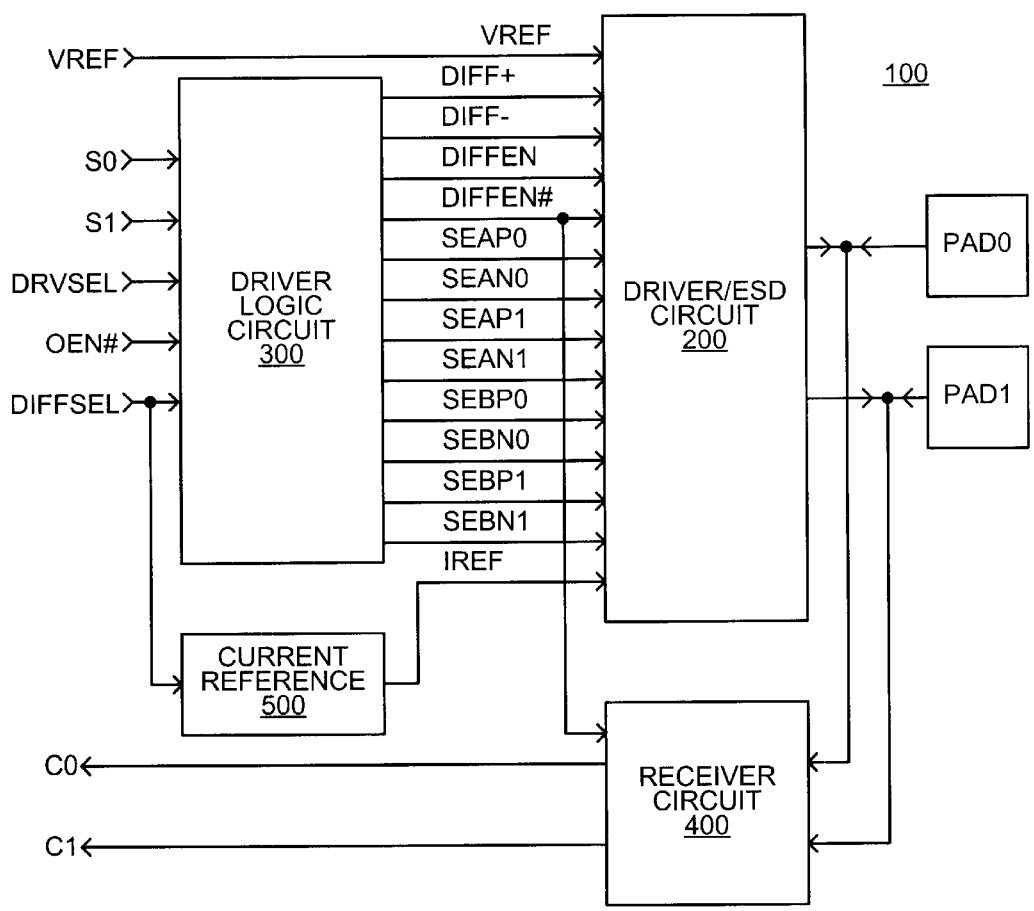
FIG. 5 illustrates, in block diagram form, a multimode I/O cell according to a second embodiment of the invention.

FIG. 5 illustrates, in block diagram form, a specific input/output cell embodiment 100. Cell 100 interfaces on the integrated circuit side with core logic operating at 1.8 V. Cell 100 itself operates at 3.3 V. In one mode, cell 100 outputs signaling compatible with Reduced Swing Differential Signaling (RSDS, a trademark of National Semiconductor Corp., as described in RSDS™ Specification, Rev. 0.95, May 2001). When driven into a 100-ohm load placed across PAD0 and PAD1, the differential voltage across the pads will be roughly 250 mV, with an offset voltage $V_{off}$ of approximately $V_{ref}$=1.3 V.

In a second mode, cell 100 outputs either one or two CMOS/TTL (3.3 V logic) signals, one on PAD0 and the other on PAD1.

In a third mode, cell 100 receives either one or two CMOS/TTL signals, one on PAD0 and the other on PAD1.

Cell 100 contains four functional blocks. Driver/ESD circuit 200 produces output signals in the various output modes, and provides ESD protection against spurious transients on PAD0 and PAD1. Driver logic circuit 300 receives 1.8 V signals from the circuit core, and converts these signals to control signals for driver/ESD circuit 200. Receiver circuit 400 performs the signal input functions for PAD0 and PAD1, providing corresponding 1.8 V signals to the circuit core on C0 and C1. Current reference 500 provides a biasing current reference IREF for the differential circuitry of driver/ESD circuit 200.

An implementation example for each block of cell 100 will now be described with reference to FIGS. 6–10.

Figure 6:
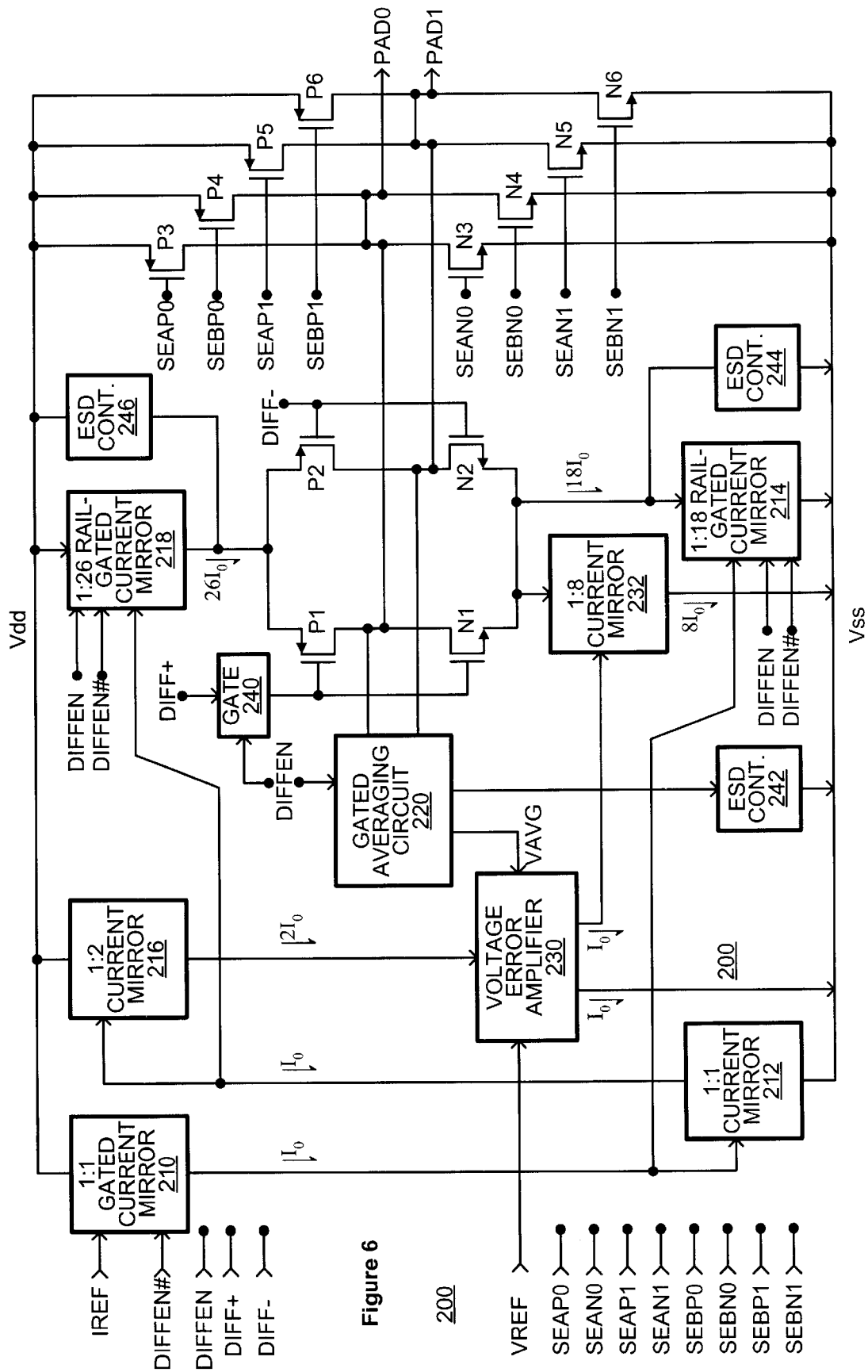
FIG. 6 contains a circuit diagram for the driver/ESD block of FIG. 5.

FIG. 6 contains a more detailed version of driver/ESD circuit 200 of FIG. 5. The operation of that circuit will be described first for a differential output mode, then for a single-ended output mode, and finally for a single-ended input mode.

In differential output mode, signal DIFFEN is asserted (and complementary signal DIFFEN# is deasserted) in order to activate the differential circuitry. Signals DIFF+ and DIFF– form the differential inputs used to control the differential driver transistor pairs P1, N1 and P2, N2. Signal IREF provides a reference current $I_0$ for generating an appropriate RSDS current level, and signal VREF provides a reference voltage for generating an appropriate RSDS bias voltage. The remaining control signals (SEAP0, SEAN0, SEAP1, SEAN1, SEBP0, SEBN0, SEBP1, and SEBN1) each control one of the single-ended output transistors (respectively P3, N3, P5, N5, P4, N4, P6, and N6). In differential mode, each SE signal controlling a PMOS transistor is driven high, and each SE signal controlling an NMOS transistor is driven low, placing the SE transistors in an ESD mode.

Gated current mirror 210 is off when DIFFEN# is asserted, but otherwise replicates IREF, supplying a reference current of magnitude $I_0$ to current mirrors 212 and 214 (which use a common mirror transistor). Current mirror 212 in turn supplies a reference current of magnitude $10$ to current mirrors 216 and 218 (which also use a common mirror transistor).

Gated averaging circuit 220 is on when DIFFEN is asserted. When on, averaging circuit 220 supplies a sample voltage VAVG, representing the instantaneous average of the voltage on PAD0 and the voltage on PAD1, to voltage error amplifier 230.

Voltage error amplifier 230 compares VREF with VAVG. Error amplifier 230 splits a reference current of magnitude $2I_0$ (from current mirror 216), such that when VREF and VAVG are equal, a reference current of magnitude $I_0$ is supplied to current mirror 232. But when VAVG rises above VREF, error amplifier 230 increases the reference current supplied to current mirror 232 (up to a maximum value of $2I_0$ if necessary). Conversely, when VAVG dips below VREF, error amplifier 230 decreases the reference current supplied to current mirror 232 (down to a minimum value of zero, if necessary).

Current mirror 218 supplies a current of magnitude $26I_0$ to the coupled sources of differential driver transistors P1 and P2 when DIFFEN is asserted. Likewise, current mirrors 214 and 232 combine to drain a current of magnitude $26I_0$ ($8I_0$ from mirror 232 and $18I_0$ from mirror 214) from the coupled sources of differential driver transistors N1 and N2 when DIFFEN is asserted.

In differential output mode signaling, one of DIFF+ or DIFF– will be a logic high, and the other will be a logic low.

Gate 240 passes DIFF+ to the gates of P1 and N1; DIFF− is supplied directly to the gates of P2 and N2. Thus when DIFF+ is logic high, a current of magnitude $2 6I_0$ will flow through P2, out PAD1 through the differential load, back in PAD0, and through N1. When DIFF+ is logic low, this current will reverse, flowing through P1, out PAD0 and through the differential load in the opposite direction, back in PAD1, and through N2.

ESD continuity circuits 242, 244, and 246 each contain transistors that are biased off, with sources tied to a voltage rail. The drains of the continuity circuit transistors connect to source/drain regions of differential circuit transistors that are not tied directly to a voltage rail and have their other source/drain region connected to a pad (e.g., P1, P2, N1, and N2).

In single-ended output mode, DIFFEN is deasserted (and DIFFEN# is asserted). This turns off gated current mirror 210, which zeros all of the differential bias currents in driver/ESD circuit 200. Rail-gated current mirrors 214 and 218 have their mirror connections opened, and their gates referenced instead to the voltage rail that biases those circuits off. Averaging circuit 220 is also turned off. Gate 240 disconnects DIFF+ from P1 and N1, instead connecting these transistors to Vdd (leaving P1 off and N1 on). DIFF− is driven low, such that P2 is on and N2 is off. Note that although N1 and P2 are technically on, each has its source coupled to a high impedance and thus the differential outputs are disabled. Optionally, each of P1, P2, N1, and N2 could be driven by a separate input, such that all four transistors can be turned off in single-ended mode.

The SE gate signals are potentially active in single-ended output mode. When a single-ended signal is driven on PAD0, two drive strengths are available. One drive strength drives SEAP0 and SEBP0 in synchronism, and SEAN0 and SEBN0 in synchronism (but complementary to SEAP0 and SEBP0). A lesser drive strength drives only one P0 and one N0 transistor, leaving the others biased off.

A second single-ended signal can also be driven concurrently on PAD1 using the remaining SE gate signals in similar fashion.

In single-ended input mode, the differential circuitry signals are set as in single-ended output mode. Further, the SE signals are set as in differential output mode. This setting places driver circuitry connected to a pad in a high-impedance state.

Figure 7:
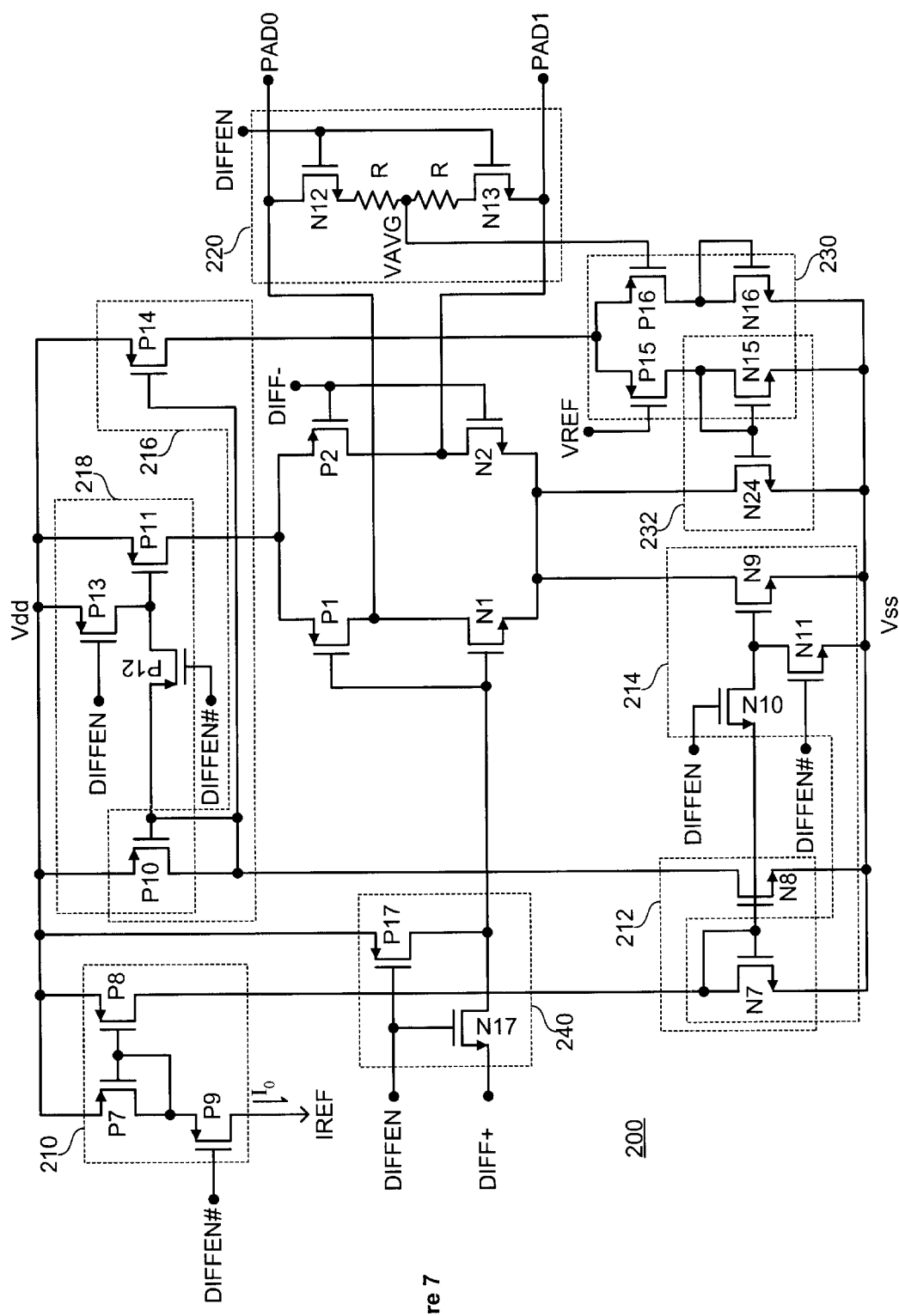
FIG. 7 contains additional circuit details for the differential section of FIG. 6.

FIG. 7 illustrates further detail for the differential circuitry portions of driver/ESD circuit 200 in one embodiment, with the ESD continuity circuits and single-ended drivers removed for clarity.

Gated current mirror 210 comprises matched transistors P7 and P8, with common sources tied to Vdd and common gates. P7 has its gate and drain shorted to a switch transistor P9 that allows IREF to flow through P7 whenever DIFFEN# is deasserted. Thus in single-ended modes, current mirror 210 is off, and in differential mode, P8 mirrors IREF.

Current mirror 212 comprises matched transistors N7 and N8, with common sources tied to Vss and common gates. N7 has its gate and drain shorted to the drain of P8, such that in differential mode, mirror 212 replicates IREF at the N8 drain node.

Current mirror 214 shares transistor N7 with current mirror 212. When DIFFEN is asserted, switch transistor N10 couples the gate of transistor N9 to the gate of transistor N7. Transistor N9 has 18 parallel channels, each dimensionally identical to the single channel of N7, such that N9 mirrors 18 times IREF when on. Note that when DIFFEN is deasserted, not only is the gate of N9 disconnected from the gate of N7, but the N9 gate is biased to Vss instead through switch transistor N11, which uses DIFFEN# as a gate signal.

Current mirror 216 comprises transistors P10 and P14, with common sources tied to Vdd and common gates. P10 has its gate and drain shorted to the drain of N8, such that in differential mode, mirror 216 is referenced to IREF. Transistor P14 has two parallel channels, each dimensionally identical to the single channel of P10, such that P14 mirrors twice IREF when on.

Current mirror 218 shares transistor P10 with current mirror 216. When DIFFEN# is deasserted, switch transistor P12 couples the gate of transistor P11 to the gate of transistor P10. Transistor P11 has 26 parallel channels, each dimensionally identical to the single channel of P10, such that P11 mirrors 26 times IREF when on. Note that when DIFFEN is deasserted, not only is the gate of P11 disconnected from the gate of P10, but the P11 gate is biased to Vdd instead through switch transistor P13, which used DIFFEN as a gate signal.

Voltage error amplifier 230 receives the 2 IREF-magnitude current produced by mirror 216, and apportions that current between two identical paths to Vss. Each path comprises a P-channel transistor with its source coupled to the drain of P14, and an N-channel transistor with its source coupled to Vss, the drain of the P-channel transistor coupled to the drain and gate of the N-channel transistor.

In one path, the P-channel transistor P15 receives a gate signal VREF, and in the other path, the P-channel transistor P16 receives a gate signal VAVG. It can be appreciated that when VAVG≈VREF, a current of magnitude IREF will flow through each path. When VAVG is greater than VREF, P16 will carry less current than P15; when VAVG is less than VREF, P15 will carry less current than P16.

The current that passes through P15 also passes through N15. N15 and N24 share common source and gate nodes. Transistor N24 has eight parallel channels, each dimensionally identical to the single channel of N15, such that N24 mirrors eight times the current passing through N15.

Gated averaging circuit 220 comprises the serial combination of transistor N12, two resistors of resistance R (e.g., R=2.8 kΩ), and transistor N13, bridged between PAD0 and PAD1. Transistors N12 and N13 are identical switch transistors driven by a common gate signal DIFFEN. N12 has one source/drain node connected to PAD0, and N13 has one source/drain node connected to PAD1. When DIFFEN is asserted, the two series resistors are effectively connected across PAD0 and PAD1. The voltage VAVG, measured between the two resistors, thus represents a voltage midway between the PAD0 and the PAD1 voltage, no matter which of PAD0 or PAD1 is at a higher voltage.

Finally, gate 240 contains switch transistors P17 and N17, each driven by a gate signal DIFFEN. When DIFFEN is asserted, N17 is on, and DIFF+ drives P1 and N1. When DIFFEN is deasserted, P17 is on, and pulls the gates of P1 and N1 high.

All P-channel transistors in FIGS. 6 and 7 have their n-wells referenced to Vdd.

Figure 8:
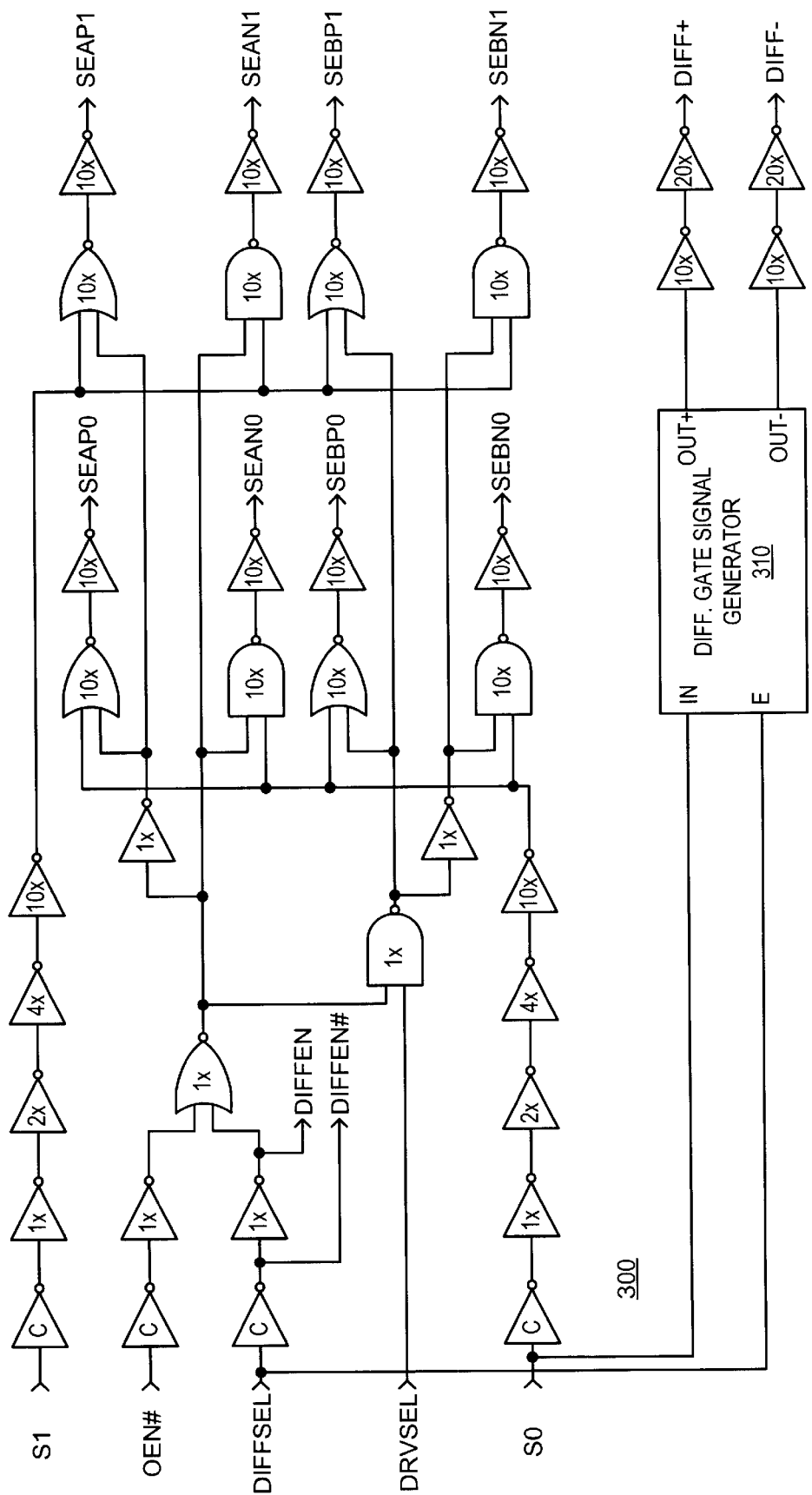
FIG. 8 illustrates a logic gate implementation for the driver logic circuit block of FIG. 5.

FIG. 8 shows one implementation for a driver logic circuit 300. 1.8 V logic signals S0, S1, OEN#, DIFFSEL, and DRVSEL are inputs to logic circuit 300. The input inverters identified with a "C" are conditioning inverters that accept a 1.8 V logic input and provide a 3.3 V logic output. The remaining single-ended control logic gates in circuit 300 operate as 3.3 V logic gates (all of the differential control logic operates at 1.8 V). The identifiers within those gates, ending in "x", indicate the relative size of each gate.

Signal DIFFSEL determines whether the differential driver circuitry will be enabled. DIFFSEL is supplied to the enable (E) input of differential gate signal generator 310.

Differential gate signal generator 310 accepts S0 as a 1.8 V input signal IN, and creates two 1.8 V output signals OUT+ and OUT−. One embodiment for generator 310 uses two serial inverters to create OUT+ from IN, and three faster serial inverters to create OUT− from IN with approximately the same timing but opposite phase. When E is deasserted, however, both OUT+ and OUT− produce logic low signals regardless of the signal present at S0. The signals generated at OUT+ and OUT− are buffered up to a higher drive strength (but remain 1.8 V logic signals) to form output signals DIFF+ and DIFF−, respectively.

Signal OEN# is asserted (low) whenever any output driver circuitry will be enabled. When asserted at the same time as DIFFSEL, however, DIFFSEL blocks the single-ended logic circuitry from responding to OEN#. Thus when OEN# is logic high or DIFFSEL is logic high, all single-ended outputs will be set to turn off their respective SE driver transistors regardless of the state of S0 and S1. When both OEN# and DIFFSEL are logic low, at least some of the single-ended outputs will respond to S0 and S1.

Which single-ended outputs respond to S0 and S1 depends in part on the state of DRVSEL. In single-ended mode, all "SEAxy" outputs respond to Sy. Further, when DRVSEL is set to logic high, all "SEBxy" outputs respond to Sy as well; otherwise, the "SEBxy" outputs continue to turn off their respective SE driver transistors.

Note that in this embodiment, signal S0 provides an input for a drive signal in both single-ended and differential output modes, and S1 provides an input for a drive signal in single-ended mode. It is straightforward to modify circuit 300 to provide different behavior, e.g., the ability to output one but not both S0 and S1 in a single-ended mode, the ability to use a separate input, even an analog input, for the differential channel, etc.

Figure 9:
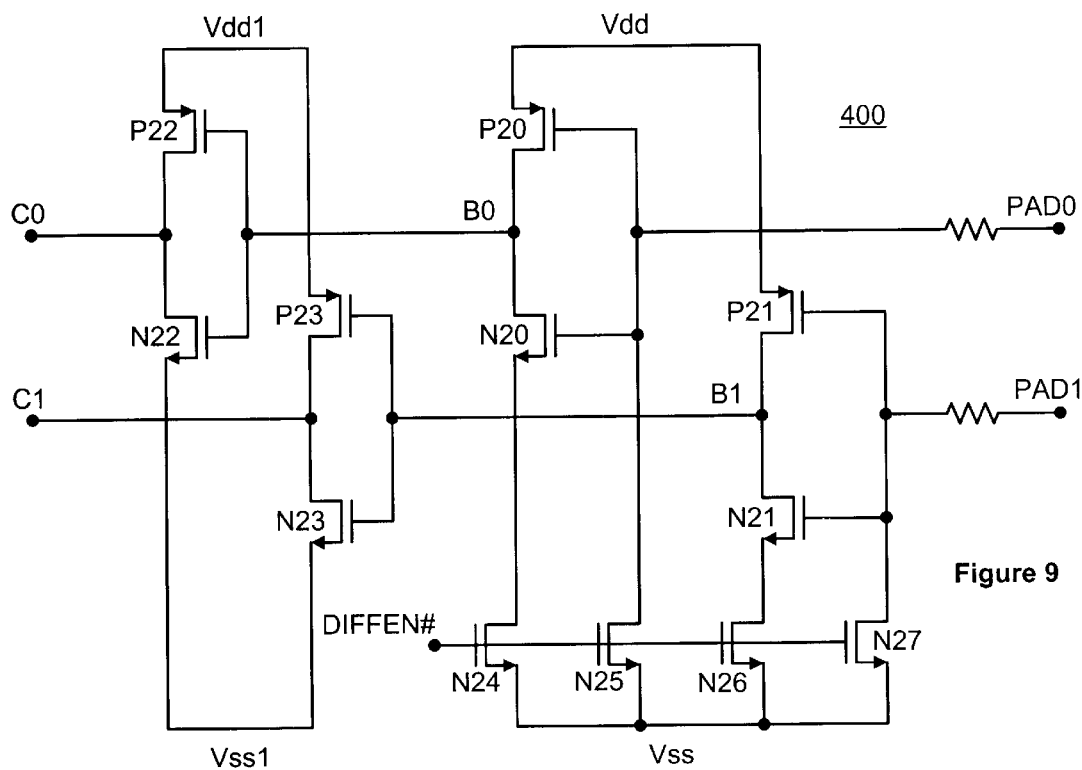
FIG. 9 contains a circuit diagram for the receiver circuit of FIG. 5.

FIG. 9 illustrates one embodiment for receiver circuit 400 of FIG. 5. PAD0 connects through a resistance R1 (e.g., 622 Ω) to the gates of transistors P20 and N20 (which share a common drain node B0), and to the drain of transistor N25 (which has a source connected to Vss). A transistor N24, connected between the source of N20 and Vss, determines whether N20 can pull node B0 low. When DIFFEN# is low (indicating differential output mode), N24 and N25 are off, and circuit 400 presents a high impedance to the differential driver. When DIFFEN# is high (indicating either single-ended input or output mode), N24 and N25 are on, allowing: pair P20, N20 to produce at B0 an inverted version of the signal present at PAD0, when PAD0 is driven; N25 to pull PAD0 low through R1, when PAD0 is not driven. Note that N25 is a weak device, e.g., a long-channel transistor, such that a drive transistor can easily dominate the signal at PAD0 despite the pulldown effect through N25.

Node B0 drives the gates of P22 and N22, which are connected in a conventional inverter configuration between Vdd1 and Vss1 (e.g., 1.8 V logic rails), with an output at node C0. C0 thus replicates the logical condition present at PAD0, in 1.8 V logic, when PAD0 is not in differential mode.

Transistors P21, N21, P23, N23, N26, and N27 perform a similar function (for PAD1) to that just described for the transistors serving PAD0.

Figure 10:
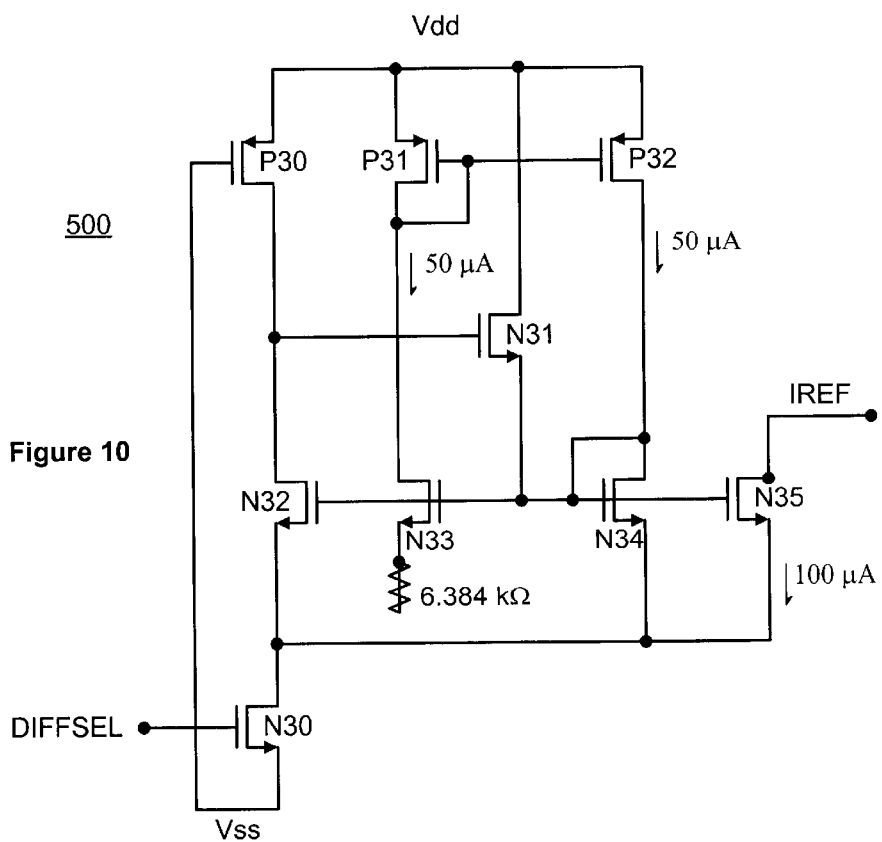
FIG. 10 contains a circuit diagram for the current reference of FIG. 5.

FIG. 10 shows one possible implementation for current reference 500 of FIG. 5. Signal DIFFSEL turns on transistor N30 when asserted, allowing reference 500 to generate reference current IREF. Mirror transistors P31 and P32 are identical. Mirror transistor N35 contains two parallel channel regions, each identical to the single channel of mirror transistor N34, and thus generates twice the current as N34. Reference 500 is designed to produce a 50 $\mu$A current through N34 (and thus a 100 $\mu$A current IREF) when Vdd−Vss=3.3 V.

Figure 11:
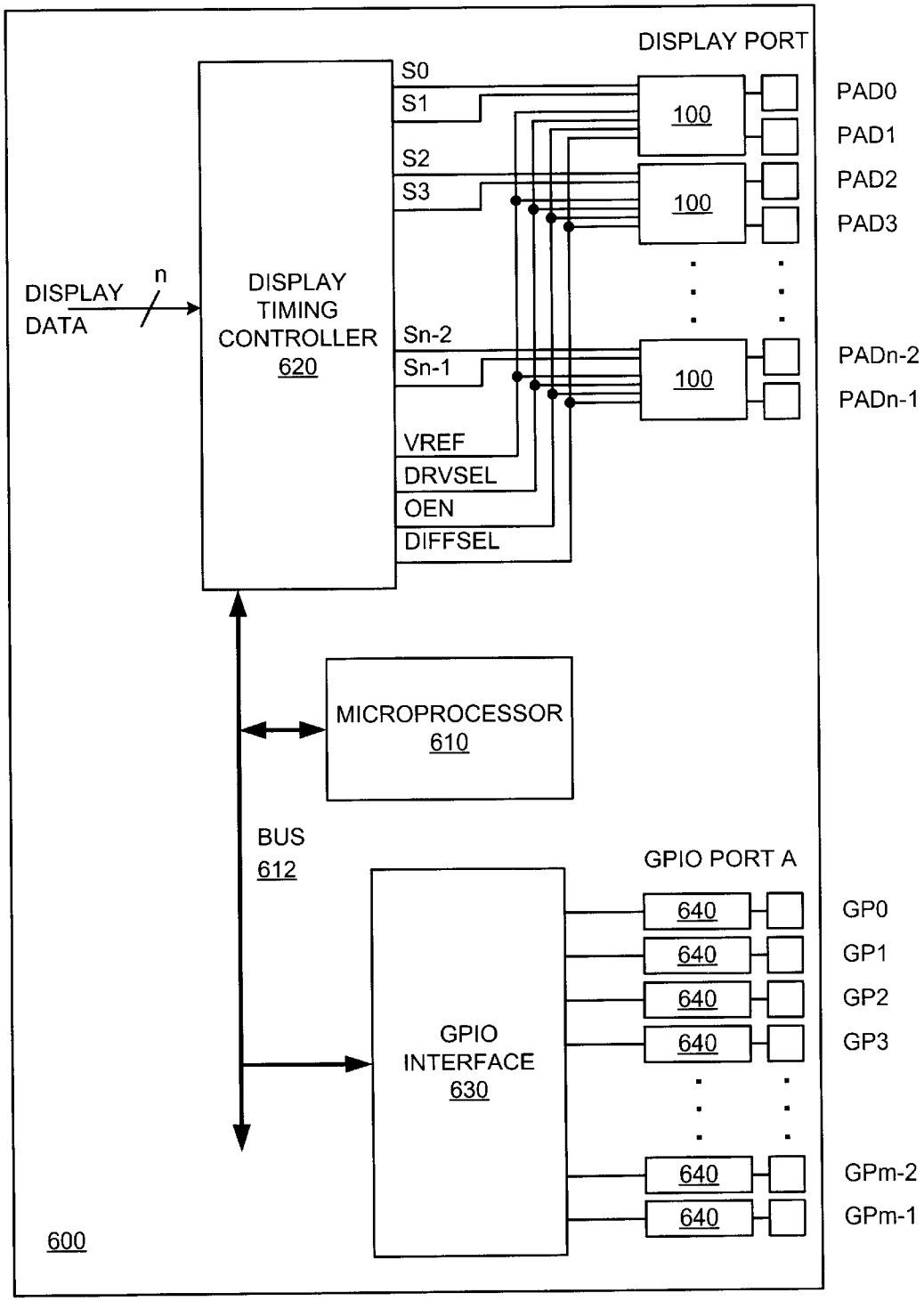
FIG. 11 shows a block diagram for part of an integrated circuit incorporating a block of I/O cells according to an embodiment of the invention.

FIG. 11 illustrates one application of an I/O cell embodiment in an integrated circuit, e.g., an image processor circuit that manipulates input video and/or graphics signals (not shown) to produce signals appropriate for a display device. Programmable timing controller (TCON) 620 accepts display data, e.g., as n-bit-wide data words. Microprocessor 610 configures TCON 620, using bus signaling on bus 612, in one of several possible output modes. For instance in one mode, TCON 620 could drive all n bits of a data word in parallel—through the n/2 I/O cells 100—on Display Port pads PAD0 through PAD(n−1) in one output clock cycle as CMOS/TTL single-ended outputs. In another mode, TCON 620 could drive n/2 of the n bits in parallel in two consecutive output clock cycles—this time using each I/O cell 100 to drive one bit differentially—across two pads—during each clock cycle. Or, in another mode TCON 620 could read an input word from the I/O cells and transmit the word to the microprocessor. In each mode, TCON 620 generates the appropriate DRVSEL, OEN, and DIFFSEL signals to each I/O cell 100 to configure the I/O cell in the appropriate mode.

For comparison, a general-purpose I/O (GPIO) interface 630 is also shown connected to bus 612. GPIO unit 630 connects to Port A pads GP0 to GP(m−1) through conventional I/O cells 640. Although not shown exactly to scale, the comparison is intended to represent that the multimode I/O cells 100 take up no more room, on a per-pad basis, than the conventional cells 640.

The multimode examples presented above are merely exemplary—for instance, the data word width and number of Display Port pads need not match, and the timing need not be as expressed. TCON 620 can use any of a variety of multiplexing schemes to drive data on the output pads. The illustrations are intended only to demonstrate the flexibility of such an integrated circuit in interfacing with different external display circuitry.

One of ordinary skill in the art will recognize that the concepts taught herein can be tailored to a particular application in many other advantageous ways. For instance, although RSDS signaling is shown, another signaling format, such as LVDS (Low Voltage Differential Signaling) could be employed—or configurable voltage and current references could be used to supply signals in multiple programmable differential formats. In general, the voltages, currents, resistance values, transistor ratios and configurations, etc. disclosed herein merely demonstrate a few implementations, and can be readily adapted to other implementations. Although a "pad" includes bonding pads such as typical in the industry, the exact mechanism used to interface the circuit with external circuitry is not critical to the invention, and thus a "pad" could include any such mechanism. Such minor modifications are encompassed within the invention, and are intended to fall within the scope of the claims.

The preceding embodiments are exemplary. Although the specification may refer to an "one", "another", or "some" embodiment(s) in several locations, this does not necessarily mean that each such reference is to the same embodiment(s), or that the feature only applies to a single embodiment.

What is claimed is:

1. An integrated circuit having an output cell comprising:

first, second, third, and fourth complementary field-effect transistor pairs, each pair comprising a p-channel transistor and an n-channel transistor connected at their drains to a drain node, each p-channel transistor having a source coupled to a supply voltage, each n-channel transistor having a source coupled to a reference voltage, the first and second transistor pairs connected in a differential configuration;

a first conductive pad electrically connected to the drain nodes of the first and third transistor pairs;

a second conductive pad electrically connected to the drain nodes of the second and fourth transistor pairs; and a multimode logic circuit connected to the transistor gates of the first, second, and third transistor pairs, the multimode logic circuit having a first output mode that drives the gates of the first and second transistor pairs to create a differential output signal on the first and second conductive pads with the third and fourth transistor pairs disabled, the multimode logic circuit having a second output mode that drives the gates of the third transistor pair to create a single-ended output signal on the first conductive pad with the first and second transistor pairs disabled.

2. The integrated circuit of claim 1, the multimode logic circuit connected to the transistor gates of the fourth transistor pair and having the capability, in the second output mode, to drive the gates of the fourth transistor pair to create a second single-ended output signal on the second conductive pad.

3. The integrated circuit of claim 2, further comprising fifth and sixth transistor pairs configured similar to the third and fourth transistor pairs, the first conductive pad electrically connected to the drain nodes of the fifth transistor pair, the second conductive pad electrically connected to the drain nodes of the sixth transistor pair, the multimode logic circuit having a third output mode that disables the first and second transistor pairs and drives the gates of both the third and fifth transistor pairs simultaneously from the same signal, to create a third single-ended output signal on the first conductive pad, the third single-ended output signal having a different drive strength than the first single-ended output signal.

4. The integrated circuit of claim 3, wherein in the third output mode the logic circuit drives the gates of both the fourth and sixth transistor pairs simultaneously from the same signal, to create a fourth single-ended output signal on the second pad, the fourth single-ended output signal having a different drive strength than the second single-ended output signal.

5. The integrated circuit of claim 1, wherein the differential output signal of the first output mode and the single-ended output signal of the second output mode use the same source signal.

6. The integrated circuit of claim 1, wherein the multimode logic circuit disables a transistor pair by coupling the gate of that pair's p-channel transistor to a positive voltage rail and coupling the gate of that pair's n-channel transistor to a negative voltage rail.

7. The integrated circuit of claim 1, wherein for the fourth transistor pair, the gate of the p-channel transistor is coupled to a positive voltage rail and the gate of the n-channel transistor is coupled to a negative voltage rail.

8. The integrated circuit of claim 1, further comprising a programmable processor coupled to the multimode logic circuit, the processor capable of setting the mode of the multimode logic circuit.

9. The integrated circuit of claim 8, further comprising input circuitry connected to the first and second conductive pads, the multimode logic circuit having a third mode that enables the input circuitry and disables the first, second, third, and fourth transistor pairs.

10. The integrated circuit of claim 9, wherein the input circuitry comprises a switched pulldown resistor connected between the first conductive pad and the reference voltage, the switched pulldown resistor controlled by the multimode logic circuit such that in a differential mode, the pulldown resistor is deactivated, and in a single-ended mode, the pulldown resistor is activated.

11. The integrated circuit of claim 1, wherein the differential output signal is driven as an analog signal.

12. The integrated circuit of claim 1, further comprising a feedback circuit to sense an average pad voltage, representing the average of the voltage at the first conductive pad and the voltage at the second conductive pad and set a differential output signal bias voltage, in the first output mode, to match the average pad voltage to a reference voltage.

13. The integrated circuit of claim 12, wherein the first and second transistor pair p-channel transistors couple to the supply voltage through an upper current source, and wherein the first and second transistor pair n-channel transistors couple to the reference voltage through a lower current source and a parallel feedback current source, the parallel feedback current source driven by the feedback circuit to set the differential output signal bias voltage.

14. The integrated circuit of claim 13, wherein a sum current through the feedback current source and the lower current source is nominally equal to the current through the upper current source.

15. The integrated circuit of claim 13, the parallel feedback circuit comprising a differential circuit to compare the average pad voltage to the reference voltage, decrease the current through the parallel feedback current source when the average pad voltage is higher than the reference voltage, and increase the current through the parallel feedback current source when the average pad voltage is lower than the reference voltage.

16. The integrated circuit of claim 1, wherein the first, second, third, and fourth transistor pairs comprise an output cell, the integrated circuit having multiple such output cells, each connected to a different pair of conductive pads, the multimode logic circuit controlling the output mode for each of the output cells.

* * * * *

UNITED STATES PATENT AND TRADEMARK OFFICE
CERTIFICATE OF CORRECTION

PATENT NO. : 6,566,911 B1
DATED : May 20, 2003
INVENTOR(S) : Todd K. Moyer

It is certified that error appears in the above-identified patent and that said Letters Patent is hereby corrected as shown below:

Column 4,
Line 39, reads "of magnitude 10 to" should read -- of magnitude $I_0$ to --

Column 6,
Line 31, reads "VAVG≈≈VREF," should read -- VAVG= = VREF, --
Lines 41-42, reads "resistance R (e.g., R=2.8" should read -- resistance $R$ (e.g., $R$=2.8 --

Column 7,
Line 26, reads ""SEAxy" outputs respond to Sy." should read -- "SEA$xy$" outputs respond to S$y$ --
Line 27, reads ""SEBxy" outputs respond" should read -- "SEB$xy$" outputs respond --
Line 28, reads "Sy as well; otherwise, the "SEBxy" outputs" should read -- S$y$ as well; otherwise, the "SEB$xy$" outputs --

Column 8,
Line 12, reads "e.g., as n-bit-wide data" should read -- e.g., as $n$-bit-wide data --
Line 15, reads "drive all n bits of a" should read -- drive all $n$ bits of a --
Line 16, reads "the n/2 I/O cells" should read -- the $n$/2 I/O cells --
Line 17, reads "PAD(n-1)in one" should read -- PAD($n$-1) in one --
Line 19, reads "drive n/2 of the n bits in" should read -- drive $n$/2 of the $n$ bits in --

Column 10,
Line 29, reads "pad and set a" should read -- pad, and set the --
Line 38, reads "source, the parallel feedback" should read -- source, the feedback --
Line 41, reads "wherein a sum" should read -- wherein the sum --
Line 45, reads "the parallel feedback" should read -- the feedback --

UNITED STATES PATENT AND TRADEMARK OFFICE
CERTIFICATE OF CORRECTION

PATENT NO.    : 6,566,911 B1
DATED         : May 20, 2003
INVENTOR(S)   : Todd K. Moyer It is certified that error appears in the above-identified patent and that said Letters Patent is hereby corrected as shown below:

Column 10 (cont'd),
Lines 48 and 50, reads "through the parallel feedback" should read -- through the feedback --

Signed and Sealed this

Twenty-third Day of December, 2003

JAMES E. ROGAN
*Director of the United States Patent and Trademark Office*